United States Patent [19]

Altoz

[11] 4,057,104

[45] Nov. 8, 1977

[54] TEMPERATURE CONTROLLED AIRBORNE ELECTRONIC ASSEMBLY

[75] Inventor: Frank E. Altoz, Baltimore, Md.

[73] Assignee: Westinghouse Electric Corporation, Pittsburgh, Pa.

[21] Appl. No.: 717,965

[22] Filed: Aug. 26, 1976

[51] Int. Cl.² .................. F28D 15/00; G05D 23/00
[52] U.S. Cl. .................. 165/35; 165/104 S; 165/105; 343/705; 244/117 A; 244/163; 174/15 R; 174/16 HS
[58] Field of Search .............. 174/15 R, 16 HS; 244/163, 117 A; 343/705, 8; 165/105, 35; 361/381–385

[56] References Cited

U.S. PATENT DOCUMENTS

| | | | |
|---|---|---|---|
| 3,024,298 | 3/1962 | Goltsos et al. | 174/15 R |
| 3,067,594 | 12/1962 | Bland et al. | 244/117 A |
| 3,143,592 | 8/1964 | August | 174/16 HS |
| 3,489,203 | 1/1970 | Fischell | 244/117 A |
| 3,548,930 | 12/1970 | Byrd | 165/105 |
| 3,780,356 | 12/1973 | Laing | 317/324 |
| 3,824,598 | 7/1974 | Beaussay et al. | 343/705 |
| 3,852,805 | 12/1974 | Brzozuwski | 165/105 |

Primary Examiner—Ronald H. Lazarus
Assistant Examiner—Theophil W. Streule, Jr.
Attorney, Agent, or Firm—D. F. Straitiff

[57] ABSTRACT

A streamlined electronic-component-containing pod is mounted on the exterior of a military aircraft in subjection to the airflow past the aircraft during flight. An evaporator in the pod is close coupled thermally to the electronic components for cooling. The outer skin of the pod acts as a condenser for return of liquid refrigerant to the evaporator during normal flight operations. During short-term high-speed dash operation the outer skin of the pod becomes too hot for condensing refrigerant vapor, which then becomes condensed by a heat sink. At this time the refrigerant at the outer skin remaining in the vapor phase acts as thermal insulation.

6 Claims, 7 Drawing Figures

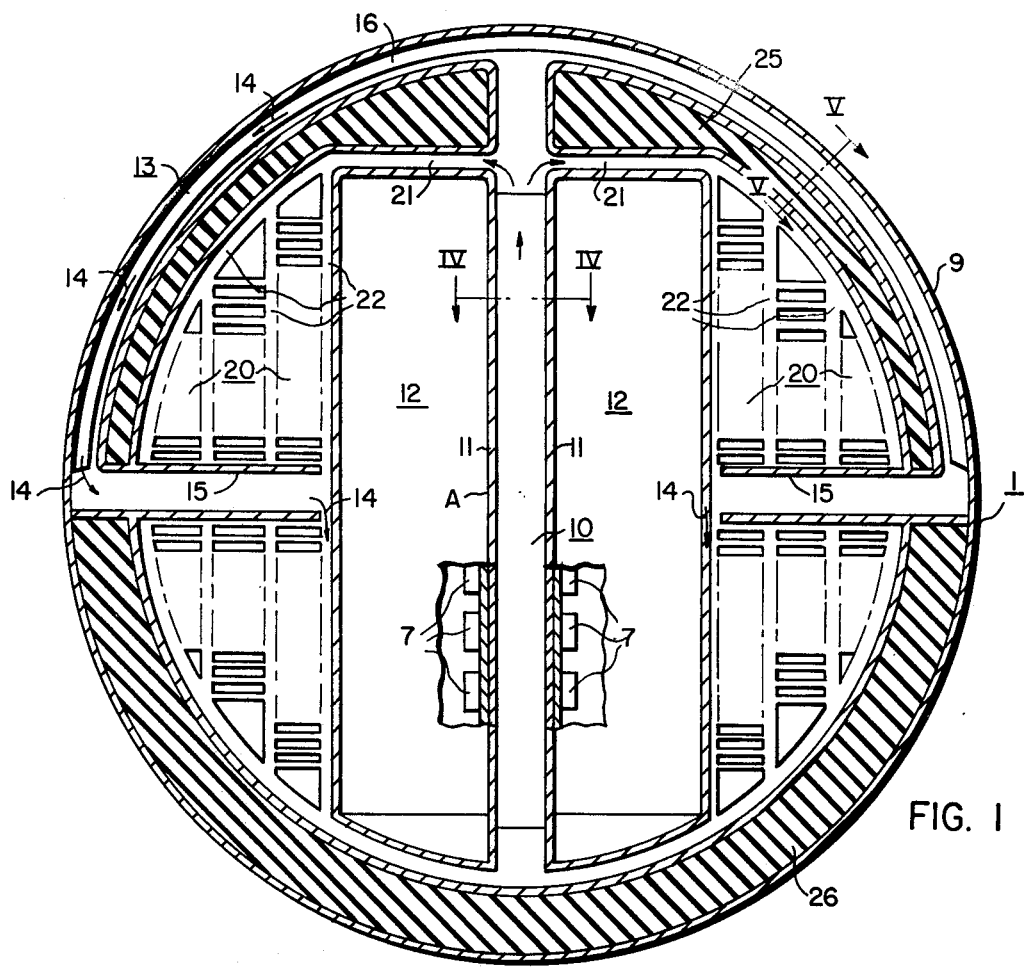
FIG. 1
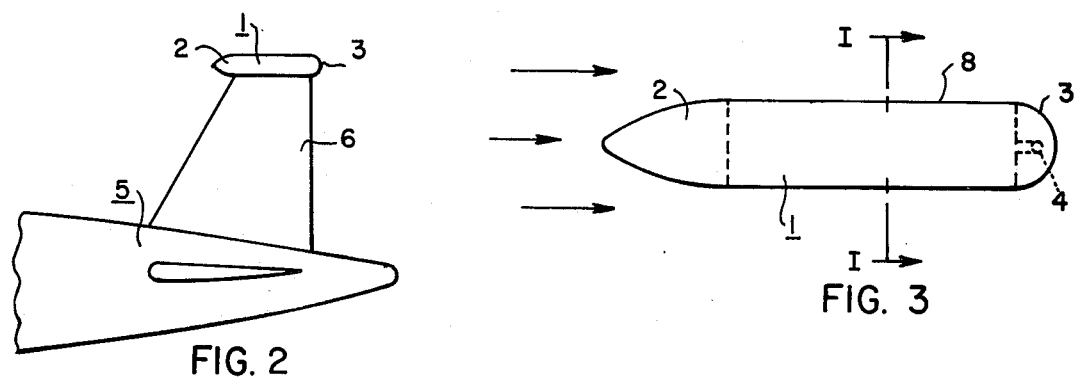
FIG. 2
FIG. 3
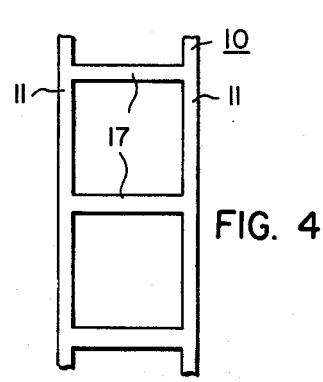
FIG. 4
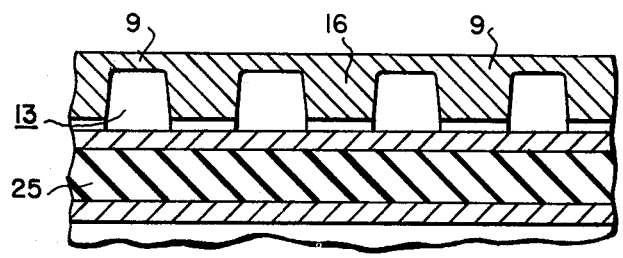
FIG. 5

TEMPERATURE CONTROLLED AIRBORNE ELECTRONIC ASSEMBLY

GOVERNMENT CONTRACT

The invention herein described was made in the course of or under a contract with the U.S. Department of the Air Force.

FIELD OF THE INVENTION

Heat dissipating assemblies utilizing closed cycle evaporative cooling for temperature control.

DESCRIPTION OF THE PRIOR ART

A patentability search directed to the present invention uncovered the following U.S. Pat. Nos. 3,777,811 to Shlosinger; 3,273,634 to Snelling; and 2,886,746 to Saby.

The Saby patent discloses a cooling system for a heat generating electrical component which uses a convection-circulated refrigerant that transfers heat from component to container wall that acts as a condenser by transmission of heat to the air surrounding such container. The container is blunt ended and it is not suggested that it be disposed on the exterior of a high speed jet aircraft in the path of air flow past such craft. Furthermore, the Saby arrangement fails to take into account any need for transfer of the condenser function to another means in the presence of excessive air temperature at the exterior of the container.

The Snelling patent is directed to a system for protecting an object from temperature change. It involves isolating the object from the ambient environment by use of several heat sinks and insulation; the heat sinks being thermally coupled together by a vaporizable heat transfer fluid.

The Sholsinger patent is directed to a heat pipe with dual working fluids, one of higher efficiency subject to freezing at low heat loads and one of less efficiency that sustains heat pipe action when such high-efficiency working fluid is frozen. Both working fluids are in use during non-freezing conditions.

SUMMARY OF THE INVENTION

The present invention, in providing a passive cooling system for heat-generating airborne electronic components that is effective both during normal sub-sonic flight conditions as well as during temporary supersonic dash flight conditions, yet relies only on air cooling of the outer skin of the pod containing such components, affords a high degree of flexibility in location of such components and divorces same from reliance on an external cooling system at a remote site. A weight saving can result in elimination of need for lengthy coolant lines an active or power-operated refrigeration system, and/or lengthy coax cable runs.

BRIEF DESCRIPTION OF THE DRAWINGS

FIG. 1 is a cross-sectional elevation view of a pod containing electronic components and cooling system for such components constructed in accord with the present invention;

FIG. 2 is a side elevation view of the tail section of a jet airplane with the pod of FIG. 1 mounted at the upper end of the rudder for suitable disposition as to use of the electronic components within the pod and for cooling in accord with the present invention;

FIG. 3 is a side view of the pod of the present invention shown in conjunction with certain dimensional and mathematical symbols pertaining to design of the cooling system of the present invention;

FIG. 4 is a fragmentary bottom view of an evaporator section of the cooling system of the present invention, taken in the direction of the arrow IV in FIG. 1;

FIG. 5 is a fragmentary cross-sectional view of the outer skin area of the pod of FIGS. 1, 2, and 3, taken along the line V—V in FIG. 1, and showing details of extended surface areas affiliated with such skin to enhance its performance as a refrigerant condenser.

DESCRIPTION OF THE PREFERRED EMBODIMENT

Figure 6:
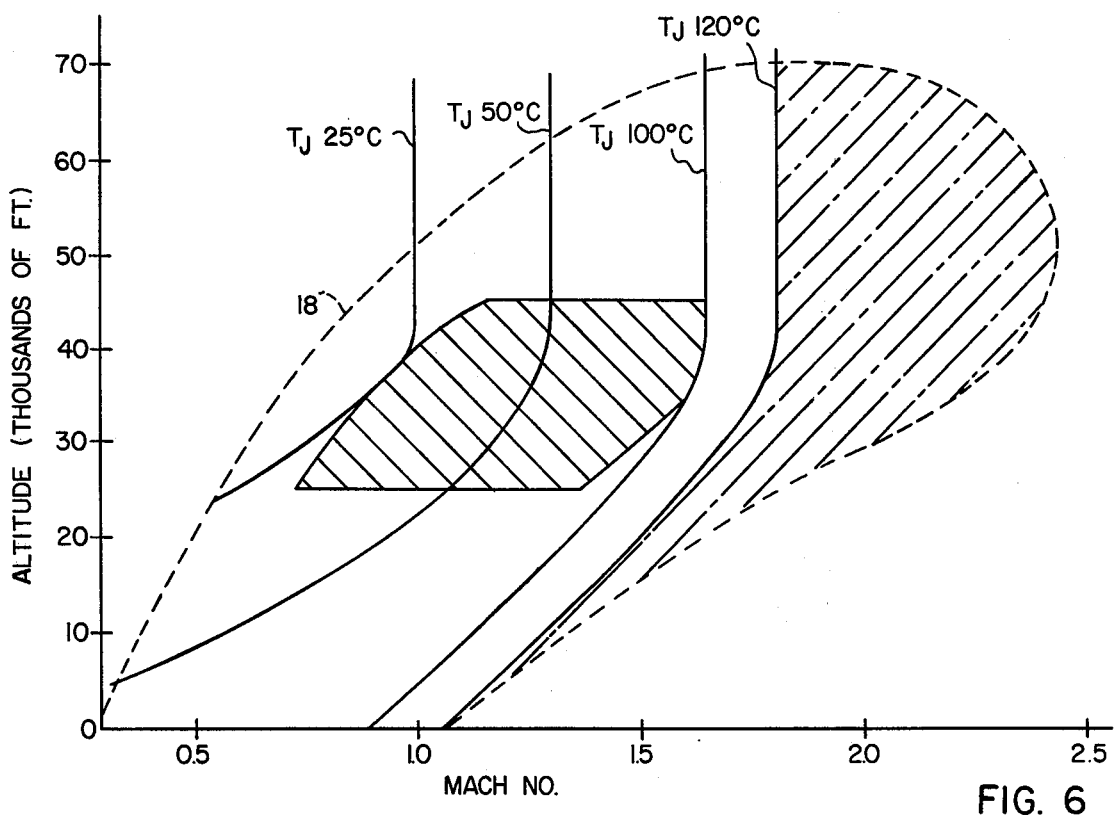
FIGS. 6 and 7 are graphs depicting performance of the cooling system of the present invention on an ICAO standard day and on a Mil Std. 210A hot day respectively relative to operating parameters of the aircraft on which the electronic-containing pod employing such system is mounted.

Referring to FIGS. 1, 2, and 3, the cooling system of the present invention was conceived primarily for use with transmit/receive radar circuitry in a tail warning system for a military jet airplane. In accord with the present invention, it is proposed to enclose the electronic components for the radar circuitry in a cylindrical pod 1 having a tapered, streamlined, nose portion 2 and a hemispherical tail end portion or radome 3 for housing the rearwardly-directed antenna 4 and to mount the pod 1 on the exterior of the airplane 5, atop the vertical stabilizer 6, for example, or otherwise at the rear of the tail section of the plane, with the radome end 3 facing rearward, in the case of tail warning radar. The electronic circuitry 7 to be cooled is located in the cylindrical portion 8 of the pod between the ends 2 and 3, and in the case of a tail warning system such circuitry includes means to provide for radar transmission and reception via the rearward antenna 4.

During most flight conditions, the temperature of the skin 9 of the pod 1 within the boundary layer of air will be about 100° F (38° C), which will be adequate to lower the temperature of a cooling fluid vapor such as Freon F 11 sufficiently to condense same for gravity flow to the bottom of an evaporator affiliated with a pair of vertical cold plates 11 on which the electronic circuits 7 in vertical planar array are mounted for close thermal coupling. During operation of the circuits 7, housed in compartments 12 at the center of the pod and at opposite sides of the cold plates 11 the heat transferred to the cold plates 11 extending vertically in close proximity will cause the cooling fluid to travel upwardly past such plates and absorb such heat from the plates and thereby become transformed into a vapor leaving the upper ends of the plates, which constitute the evaporator 10. The vapor becomes distributed across the upper inside of the pod skin 9, which, acting as a condenser 13, liquifies the coolant vapor, which runs down the inside skin wall (arrows 14) to horizontal return ducts 15, halfway up the pod, and down past the outside of the circuit compartments 12 back to the bottom of the evaporator 10. In behalf of efficiency, the skin 9 forming the outer wall of a condenser is provided with extended surfaces or fins 16, as shown in FIG. 5, and the evaporator 10 including cold walls 11 likewise is provided with fins 17 that extend between such walls, as shown in FIG. 4.

Figure 7:
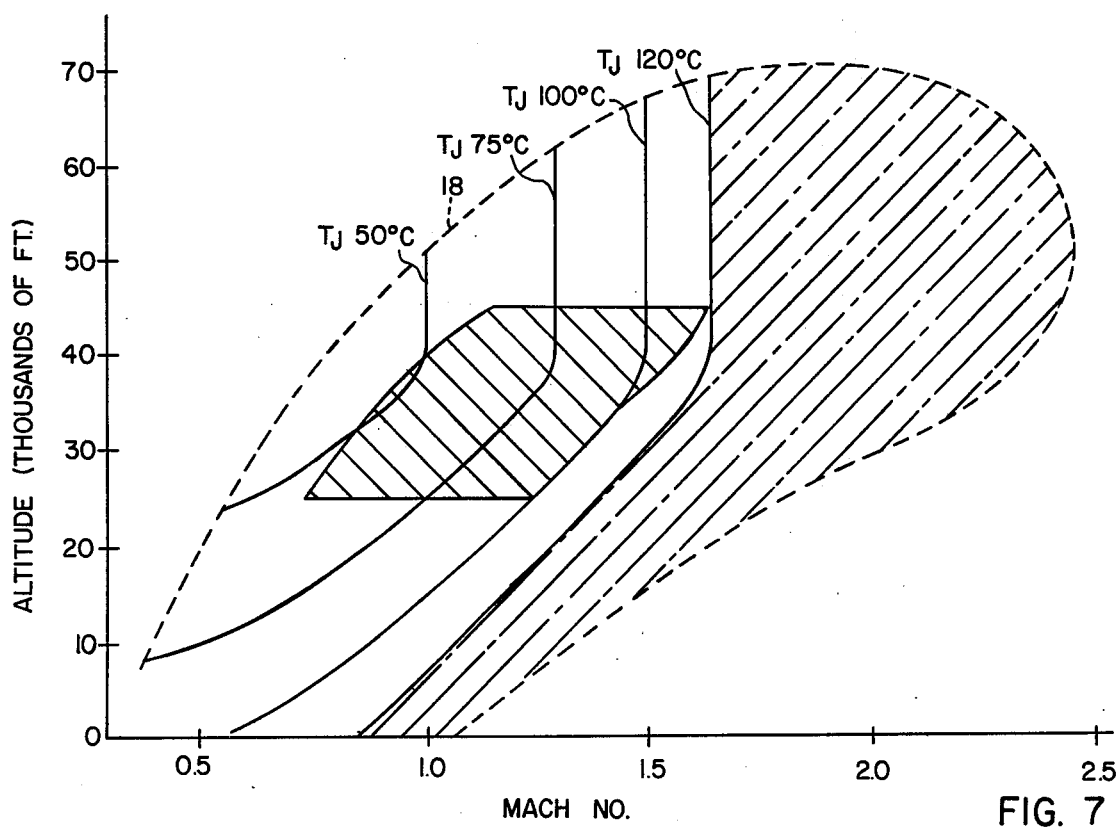

The cooling system of the present invention with the skin 9 as effective condenser can be made to provide the temperatures $T_J$ at the electronic components 7 within the pod 1 of less than 120° C as shown in FIGS. 6 and 7, when the airplane bearing the pod is operating under the conditions enclosed within the dash line 18 to the left of the $T_J$ 120° C line.

When the airplane bearing the pod 1 is operating under conditions shown within the cross-hatched region within the dash lines 18 to the right of the $T_J$ 120° C line in FIGS. 6 and 7, the electronic components can be maintained at temperatures slightly higher than 120° C for a limited time adequate for high speed dash maneuvers by automatic switch-over from the overheated pod skin 9 to a heat sink assembly 20 at opposite sides of the circuit compartments 12. The tops of the heat sink assemblies 20 is adapted to receive the cooling fluid vapor leaving the top of the evaporator 10 by way of horizontal passages 21 and each heat sink assembly includes vertical passages 22 to accommodate downward movement of the cooling fluid in liquid state to the bottom of the evaporator 10.

The heat sink assemblies may be in the form similar to a heat sink exchanger in which a phase change material is disposed within a sealed enclosure including a plurality of parallel tubes around the outer surface of which the coolant liquid from the evaporator 10 flows. A suitable phase change material for a particular tail warning radar pod-enclosed assembly presently under construction for installation on an F 15 fighter is believed to be oxalic acid dihydrate, which by experimental determination has been found to have the highest known heat of fusion per unit of weight of any material within the range of 2° C and 100° C. Inclusion of this material in a heat sink assembly is disclosed and claimed in copending U.S. patent application Ser. No. 665,599 filed Mar. 10, 1976 and assigned to the assignee of the present patent application. Other phase change materials may be found suitable for use in the present invention with less efficiency in operation.

The skin portion 9 of the pod 1 that acts as a condenser during normal flight conditions of the plane bearing such pod encircles the upper half of the electronic compartments and of the heat sink assemblies. At the time that the skin 9 becomes too hot to act as a condenser for the cooling fluid, a portion of such fluid remains in such would-be condenser as a vapor that acts as insulation of such members from the excessive skin temperature. Additional insulation 25 in the form of a light weight foam material is interposed between the condenser 13 and the upper halves of the compartments 12 and heat sink assemblies 20. The lower halves of such member are heat protected by similar insulation 26.

Upon return to normal flight conditions where the skin 9 of the pod 1 drops to a temperature less than that of the heat sink assemblies 20 as well as that of the electronic components 7 within the compartments 12, the skin 9 re-establishes as the condenser 13 and removes heat from both such components as well as the heat sink assemblies which become reconditioned for subsequent condenser functioning again during high skin temperature conditions.

What is claimed is:

1. An airborne assembly comprising,
   a pod for mounting on the exterior of an aircraft in subjection to air flow past the aircraft during flight,
   heat creating electronic components disposed within said pod, p1 evaporative cooling fluid disposed within said pod, p1 vertically extending evaporator means within said pod in close thermal coupling with said electronic components and having bottom inlet for said cooling fluid in liquid state and an upper exit for said cooling fluid in vapor state,
   a first condenser means for the cooling fluid vapor from said evaporator means utilizing the outer skin of said pod for transfer of heat to the air passing thereover,
   duct means for return of cooling fluid in liquid state from said first condenser means to said evaporator inlet,
   a second condenser means in form of heat sink means within said pod, and
   p1 duct means for conveying cooling fluid to and from said second condenser means in series with said evaporator means and in parallel with said first condenser means,
       said second condenser means being so constructed and arranged as to be effective at pod skin temperatures at which said first condenser means becomes ineffective.

2. The assembly of claim 1, in which said heat sink means employs a phase change material as heat absorbing agent.

3. The assembly of claim 2, wherein said phase change material is oxalic acid dihydrate.

4. The assembly of claim 1, wherein said pod is adapted for mounting atop the vertical stabilizer of an aircraft.

5. The assembly of claim 1, wherein the aforesaid evaporator and condenser means include extended surface means for efficient heat transfer.

6. The assembly of claim 1, wherein said first condenser means is arranged to afford insulation for the system when at too high temperature for condensing cooling vapor.

* * * * *